United States Patent
Pangrle et al.

(12)
(10) Patent No.: US 6,383,950 B1
(45) Date of Patent: May 7, 2002

(54) INSULATING AND CAPPING STRUCTURE WITH PRESERVATION OF THE LOW DIELECTRIC CONSTANT OF THE INSULATING LAYER

(75) Inventors: Suzette K. Pangrle, Cupertino; Minh Van Ngo, Fremont; Susan Tovar, Gilroy, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/974,568

(22) Filed: Oct. 10, 2001

Related U.S. Application Data

(62) Division of application No. 09/511,465, filed on Feb. 23, 2000, now Pat. No. 6,326,692.

(51) Int. Cl.[7] .............................................. H01L 21/469
(52) U.S. Cl. ...................... 438/778; 438/393; 438/255; 438/396; 438/486; 438/665
(58) Field of Search ................. 438/778, 393, 438/665, 255, 398, 486

(56) References Cited

U.S. PATENT DOCUMENTS

| | | | |
|---|---|---|---|
| 5,716,890 A | * | 2/1998 | Yao .............................. 438/624 |
| 5,754,390 A | * | 5/1998 | Sandhu et al. ............ 361/321.4 |
| 6,207,584 B1 | * | 3/2001 | Shen et al. .................. 438/762 |
| 6,211,033 B1 | * | 4/2001 | Sandhu et al. .............. 438/387 |
| 6,326,692 B1 | * | 12/2001 | Pangrle et al. .............. 257/758 |

* cited by examiner

*Primary Examiner*—Richard Elms
*Assistant Examiner*—Pho Luu
(74) *Attorney, Agent, or Firm*—Monica H. Choi

(57) ABSTRACT

An insulating and capping structure of an integrated circuit is formed on a semiconductor wafer. An insulating layer is formed on the semiconductor wafer, and the insulating layer is comprised of a dielectric material having a low dielectric constant that is less than about 4.0 and having chemical bonds that are chemically reactive with a predetermined reactant. A reaction barrier layer is formed on the insulating layer, and the reaction barrier layer is comprised of a material that is not chemically reactive with the predetermined reactant. A capping layer is formed on the reaction barrier layer, and the capping layer is formed using the predetermined reactant. The reaction barrier layer prevents contact of the predetermined reactant with the insulating layer to prevent reaction of the predetermined reactant with the chemical bonds of the dielectric material of the insulating layer that are chemically reactive with the predetermined reactant such that the low dielectric constant of the dielectric material of the insulating layer is not increased by the formation of the capping layer. The present invention may be used to particular advantage when the predetermined reactant used for forming the capping layer and that is reactive with the insulating layer is oxygen plasma and when the reaction barrier layer is comprised of silicon nitride.

11 Claims, 3 Drawing Sheets

INSULATING AND CAPPING STRUCTURE WITH PRESERVATION OF THE LOW DIELECTRIC CONSTANT OF THE INSULATING LAYER

This is a divisional of an earlier filed copending patent application, with Ser. No. 09/511,465 filed on Feb. 23, 2000 now U.S. Pat. No. 6,326,692, for which priority is claimed. This earlier filed copending patent application with Ser No. 09/511,465 is in its entirety incorporated herewith by reference.

Technical Field

The present invention relates generally to fabrication of integrated circuits, and more particularly, to forming a reaction barrier layer between a capping layer and a dielectric insulating layer having low dielectric constant for preserving the low dielectric constant of the dielectric insulating layer.

Background of the Invention

A long-recognized important objective in the constant advancement of monolithic IC (Integrated Circuit) technology is the enhancement of the speed performance of integrated circuits. A common component of an integrated circuit is interconnect for coupling the various components of the integrated circuit. Referring to FIG. 1A, a first interconnect structure 102 and a second interconnect structure 104 are formed on a first insulating layer 106 of an integrated circuit fabricated on a semiconductor wafer 108. For example, when the semiconductor wafer 108 is comprised of silicon, the first insulating layer 106 is typically comprised of silicon dioxide, and the first and second interconnect structures 102 and 104 may be aluminum metal lines.

A second insulating layer 110 is deposited to surround the first and second interconnect structures 102 and 104 and to fill the gaps between the interconnect structures 102 and 104 by a conformal deposition process, as known to one of ordinary skill in the art of integrated circuit fabrication. For enhancing the speed performance of the integrated circuit, the second insulating layer 110 surrounding the interconnect structures 102 and 104 is a dielectric material designed to have low dielectric constant. A dielectric material with low dielectric constant results in lower capacitance between the interconnect structures 102 and 104. Such lower capacitance results in higher speed performance of the integrated circuit and also in lower power dissipation. In addition, such lower capacitance results in lower cross-talk between the interconnect structures 102 and 104. Lower cross-talk between interconnect structures 102 and 104 is especially advantageous when the interconnect structures 102 and 104 are disposed closer together as device density continually increases.

Referring to FIG. 1A, a capping layer 112 is deposited on the second insulating layer 110 for various integrated circuit fabrication process steps, as known to one of ordinary skill in the art of integrated circuit fabrication. For example, the capping layer 112 may be an antireflective layer comprised of siliconoxynitride (SiON) used during a photolithography process, as known to one of ordinary skill in the art of integrated circuit fabrication. Alternatively, the capping layer 112 may be a diffusion barrier layer comprised of silicon nitride (SiN) or siliconoxynitride (SiON), a passivation layer comprised of silicon dioxide ($SiO_2$) or silicon nitride (SiN), an etch stop layer comprised of silicon nitride (SiN) or silicon carbide (SiC) films, or an CMP (Chemical Mechanical Polishing) stop layer comprised of silicon dioxide ($SiO_2$) or silicon nitride (SiN), for example, as known to one of ordinary skill in the art of integrated circuit fabrication.

Referring to FIG. 1B, the first interconnect structure 102 and the second interconnect structure 104 are formed in a damascene process. A damascene process is used when the interconnect structures 102 and 104 are comprised of material such as copper that do not etch as easily as aluminum, as known to one of ordinary skill in the art of integrated circuit fabrication. In that case, a diffusion barrier insulating material 107 is deposited on the semiconductor substrate (or on a previous interconnect layer in other integrated circuits). In addition, the insulating layer 110 having low dielectric constant is deposited on the diffusion barrier insulating material 107. The capping layer 112 is then deposited on the insulating layer 110.

Then openings are formed through the capping layer 112, the insulating layer 110, and the diffusion barrier insulating material 107 for formation of the interconnect structures 102 and 104. Such openings are filled with copper for formation of the interconnect structures 102 and 104. A first diffusion barrier layer 103 is typically formed between the first interconnect structure 102 and the insulating layer 110 for preventing diffusion of copper from the first interconnect structure 102 into the insulating layer 110. Similarly, a second diffusion barrier layer 105 is typically formed between the second interconnect structure 104 and the insulating layer 110 for preventing diffusion of copper from the second interconnect structure 104 into the insulating layer 110. Such process steps for formation of the damascene metal interconnect structures 102 and 104 are known to one of ordinary skill in the art of integrated circuit fabrication. (Elements having the same reference number in FIGS. 1A and 1B refer to elements having similar structure and function.)

In the structures of either FIG. 1A or FIG. 1B, examples of dielectric materials having low dielectric constant for the second insulating layer 110 surrounding the interconnect structures 102 and 104 are fluorinated silicon dioxide, porous versions of silicon dioxide, organic doped silica, inorganic dielectrics such as HSQ (hydrogensilsesquioxane) and MSQ (methylsilsesquioxane), and organic dielectrics such as polyarylether material, as known to one of ordinary skill in the art of integrated circuit fabrication.

Referring to FIGS. 1A and 1B, the capping layer 112 is formed on the second insulating layer 110 comprised of such a dielectric having a low dielectric constant. For formation of the capping layer 112, an oxygen containing reactant may be used. However, certain types of dielectrics having low dielectric constant are comprised of chemical bonds that are chemically reactive with the oxygen containing reactant, especially when oxygen plasma is used during deposition of the capping layer 112 in a plasma enhanced deposition process. For example, HSQ (hydrogensilsesquioxane) is comprised of $SiO_3H$, and MSQ (methylsilsesquioxane) is comprised of $SiO_3CH_3$, formed into a ladder structure or cage structure, and polyarylether material is comprised of —C—O—C— bonds, as known to one of ordinary skill in the art of integrated circuit fabrication.

Such chemical bonds within the dielectrics having low dielectric constant are chemically reactive with oxygen containing reactants. When the capping layer 112 is formed using an oxygen containing reactant, on the insulating layer 110 comprised of such dielectrics having low dielectric constant, the oxygen containing reactant may react with such chemically reactive bonds causing the increase of the dielectric constant of the insulating layer 110. For example, oxygen containing reactants may react with the dielectric material of the insulating layer 110 having Si—H (silicon to hydrogen) bonds and Si—CH$_3$ (silicon to methyl) bonds to replace such bonds with Si—OH (silicon to hydroxide) bonds. The Si—OH (silicon to hydroxide) bonds may then adsorb water (H$_2$O) from the atmosphere resulting in an increase in the dielectric constant of the insulating layer 110. Although the capping layer 112 is desired for various integrated circuit fabrication processes, a low dielectric constant is also desired for the insulating layer 110.

Thus, a mechanism is desired for forming the capping layer 112 while preserving the low dielectric constant of the dielectric material comprising the insulating layer 110.

Summary of the Invention

Accordingly, in a general aspect of the present invention, a reaction barrier layer is deposited on the insulating layer prior to formation of the capping layer to preserve the integrity of the dielectric material comprising the insulating layer.

In a general aspect of the present invention, for forming an insulating and capping structure of an integrated circuit on a semiconductor wafer, an insulating layer is formed on the semiconductor wafer. The insulating layer is comprised of a dielectric material having a low dielectric constant that is less than about 4.0 and having chemical bonds that are chemically reactive with a predetermined reactant. A reaction barrier layer is formed on the insulating layer, and the reaction barrier layer is comprised of a material that is not chemically reactive with the predetermined reactant. A capping layer is formed on the reaction barrier layer, and the capping layer is formed using the predetermined reactant. The reaction barrier layer prevents contact of the predetermined reactant with the insulating layer to prevent reaction of the predetermined reactant with the chemical bonds of the dielectric material of the insulating layer that are chemically reactive with the predetermined reactant such that the low dielectric constant of the dielectric material of the insulating layer is not increased by the formation of the capping layer.

The present invention may be used to particular advantage when the predetermined reactant used for forming the capping layer and that is chemically reactive with the insulating layer is oxygen containing reactants and when the reaction barrier layer is comprised of silicon nitride.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1A, 1B, 2, 3, 4, 5, 6, 7, and 8 refer to elements having similar structure and function.

DETAILED DESCRIPTION

Figure 1A:
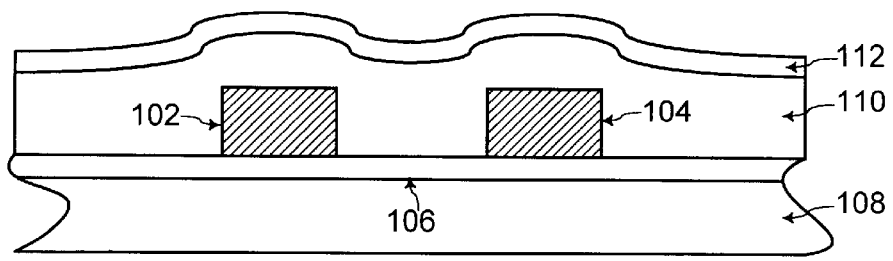
FIG. 1A shows a cross-sectional view of interconnect structures surrounded by insulating and capping layers that are conformally deposited with the insulating layer being comprised of a dielectric having a low dielectric constant, according to the prior art.
Figure 1B:
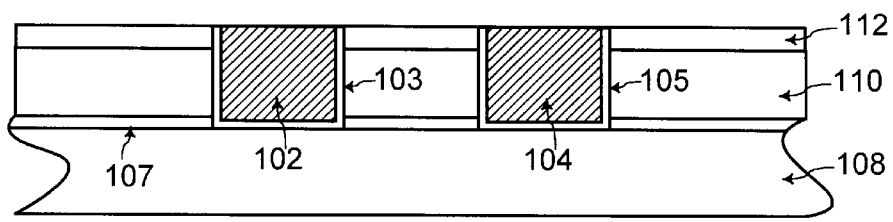
FIG. 1B shows a cross-sectional view of interconnect structures surrounded by an insulating and capping structure and formed in a damascene process with the insulating layer being comprised of a dielectric having a low dielectric constant, according to the prior art.
Figure 2:
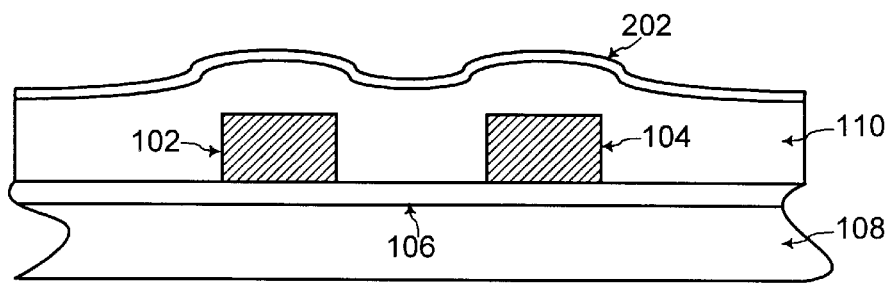
FIG. 2 shows a cross-sectional view of the insulating layer surrounding the interconnect structures with formation of a reaction barrier layer on the insulating layer, according to an embodiment of the present invention.
Figure 3:
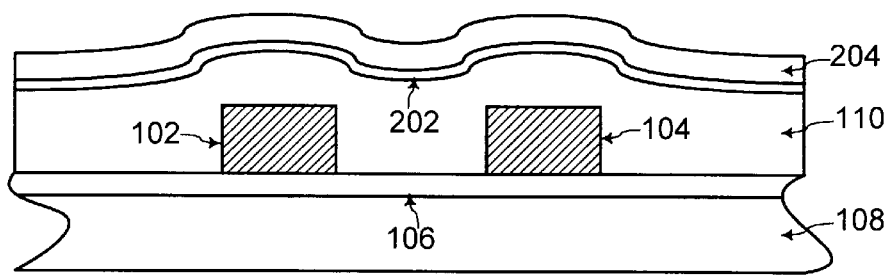
FIG. 3 shows a cross-sectional view of the insulating layer surrounding the interconnect structures with formation of the reaction barrier layer on the insulating layer before formation of a capping layer on the reaction barrier layer, according to an embodiment of the present invention.

A first embodiment of the present invention is described for depositing a capping structure over an insulating layer that has been conformally deposited over interconnect structures, as illustrated in FIG. 1A. Referring to FIG. 2, for preserving the low dielectric constant of the dielectric material comprising the insulating layer 110, a reaction barrier layer 202 is formed on the insulating layer 110. Referring to FIG. 3, a capping layer 204 is formed on the reaction barrier layer 202 such that the reaction barrier layer 202 is disposed between the insulating layer 110 and the capping layer 204.

The dielectric material having a low dielectric constant and comprising the insulating layer 110 is comprised of chemical bonds that are chemically reactive with a predetermined reactant used in forming the capping layer 204. For example, when the capping layer 204 to be formed is an antireflective layer comprised of siliconoxynitride (SiON), or a diffusion barrier layer comprised of silicon nitride (SiN) or siliconoxynitride (SiON), or a passivation layer comprised of silicon dioxide (SiO$_2$) or silicon nitride (SiN), or an etch stop layer comprised of silicon nitride (SiN) or silicon carbide (SiC) films, or an CMP (Chemical Mechanical Polishing) stop layer comprised of silicon dioxide (SiO$_2$) or silicon nitride (SiN), for example, as known to one of ordinary skill in the art of integrated circuit fabrication, an oxygen containing reactant may be used during formation of such a capping layer 204. On the other hand, the dielectric material having low dielectric constant and comprising the insulating layer 110 may be comprised of chemical bonds that are chemically reactive with the oxygen containing reactant such as for example when such dielectric material is comprised of HSQ (hydrogensilsesquioxane), MSQ (methylsilsesquioxane), polyarylether material, porous silica, or organic doped silica.

Referring to FIG. 3, the reaction barrier layer 202 formed between the insulating layer 110 and the capping layer 204 is comprised of a material that is not chemically reactive with the predetermined reactant used during formation of the capping layer 204. For example, when an oxygen containing reactant is used for formation of the capping layer 204 and when the dielectric material comprising the insulating layer 110 is comprised of chemical bonds that are reactive with the oxygen containing reactant, the reaction barrier layer 202 may be comprised of silicon nitride.

The reaction barrier layer 202 prevents contact of the predetermined reactant, with the insulating layer 110 to prevent reaction of the predetermined reactant with the chemical bonds of the dielectric material of the insulating layer 110 that are chemically reactive with the predetermined reactant. In this manner, the low dielectric constant of the dielectric material comprising the insulating layer 110 is not increased by the formation of the capping layer 204.

The present invention may be used to particular advantage when the insulating layer 110 surrounds the interconnect structures 102 and 104 of the integrated circuit. Preservation of the low dielectric constant of the dielectric material surrounding such interconnect structures further ensures lower cross-talk between the interconnect structures and higher speed performance and lower power dissipation of the integrated circuit.

Figure 4:
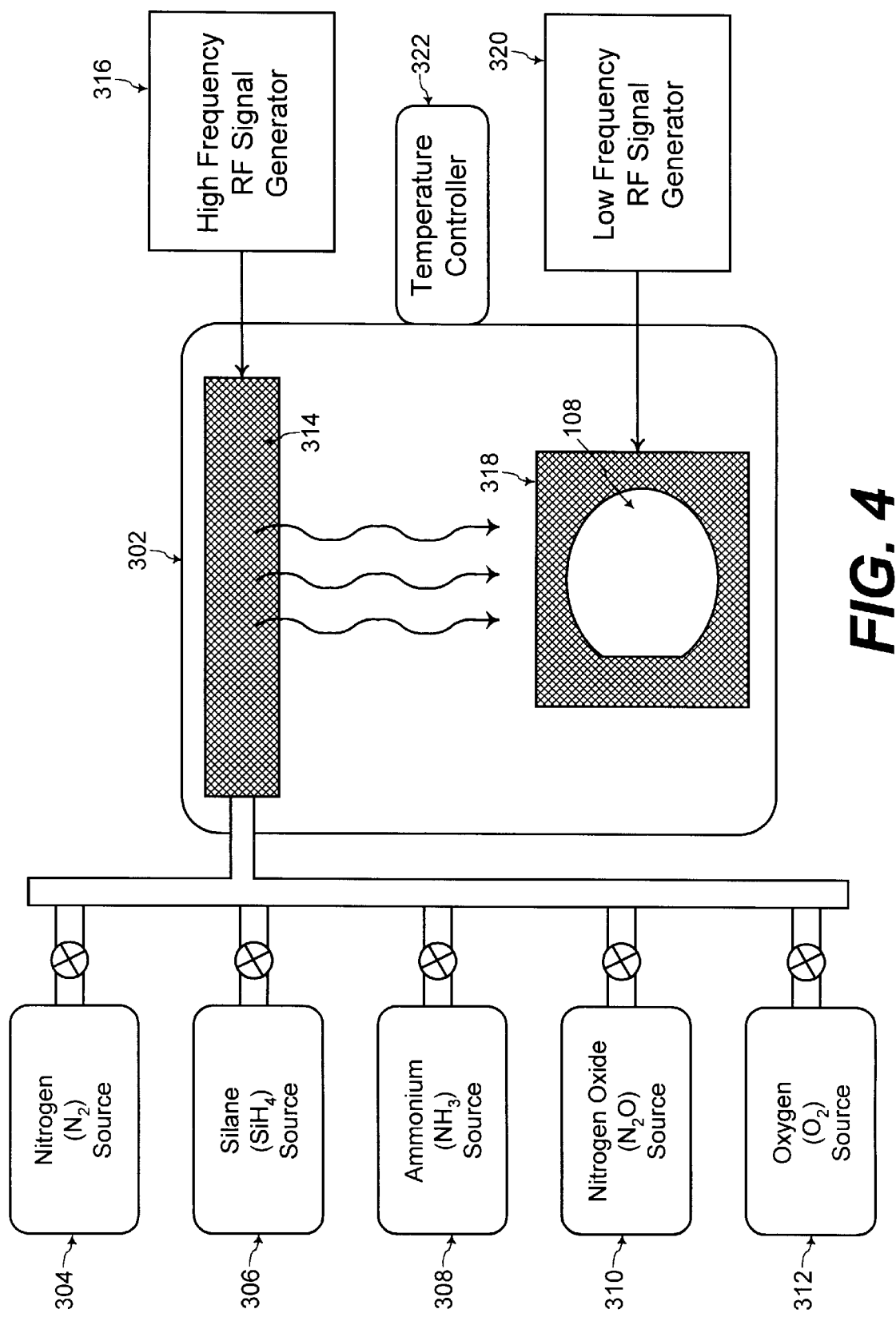
FIG. 4 shows components of a reaction chamber for forming the reaction barrier layer before formation of the capping layer on the reaction barrier layer, according to an embodiment of the present invention.

Referring to FIGS. 3 and 4, for formation of the reaction barrier layer 202 and the capping layer 204, the semiconductor wafer 108 is placed into a reaction chamber 302, according to one embodiment of the present invention. A nitrogen ($N_2$) source 304, a silane ($SiH_4$) source 306, an ammonium ($NH_3$) source 308, a nitrogen oxide ($N_2O$) source 310, and an oxygen ($O_2$) source 312 are coupled to the reaction chamber 302. Nitrogen ($N_2$) gas is controlled to flow from the nitrogen ($N_2$) source 304 into the reaction chamber 302. Silane ($SiH_4$) gas is controlled to flow from the silane ($SiH_4$) source 306 into the reaction chamber 302. Ammonium ($NH_3$) gas is controlled to flow from the ammonium ($NH_3$) source 308 into the reaction chamber 302. Nitrogen oxide ($N_2O$) gas is controlled to flow from the nitrogen oxide ($N_2O$) source 310 into the reaction chamber 302. Oxygen ($O_2$) gas is controlled to flow from the oxygen ($O_2$) source 312 into the reaction chamber 302.

The reaction chamber 302 further includes a showerhead 314 which is fed with nitrogen ($N_2$) gas from the nitrogen ($N_2$) source 304, silane ($SiH_4$) gas from the silane ($SiH_4$) source 306, ammonium ($NH_3$) gas from the ammonium ($NH_3$) source 308, nitrogen oxide ($N_2$) gas from the nitrogen oxide ($N_2$) source 310, or oxygen ($O_2$) gas from the oxygen ($O_2$) source 312. In addition, a high frequency RF signal generator 316 is operatively coupled to the showerhead 314. A high frequency RF signal from the high frequency RF signal generator 316 is applied to the showerhead 314 for producing the plasma in a plasma enhanced chemical vapor deposition process of an embodiment of the present invention. Plasma enhanced chemical vapor deposition processes are known to one of ordinary skill in the art of integrated circuit fabrication.

The reaction chamber 302 further includes a heating block 318 which holds the semiconductor wafer 108 during the plasma enhanced chemical vapor deposition of an embodiment of the present invention. The heating block 318 is heated up to a predetermined temperature to maintain the semiconductor wafer 108 at a desired temperature range. In addition, a low frequency RF signal generator 320 is operatively coupled to the heating block 318. A low frequency RF signal from the low frequency RF signal generator 320 is applied to the heating block 318 holding the semiconductor wafer 108 such that a voltage bias appears on the heating block 318. Such voltage bias on the heating block 318 attracts the plasma generated by the showerhead 314 toward the semiconductor wafer 108. Thus, plasma from the showerhead 314 is present near the semiconductor wafer 108 during the plasma enhanced chemical vapor deposition process of an embodiment of the present invention.

Furthermore, the reaction chamber 302 of an embodiment of the present invention further includes a chamber temperature controller 322. The temperature controller 322 maintains the temperature at the heating block 318 to be within a predetermined range.

Referring to FIGS. 3 and 4, for formation of the reaction barrier layer 202 on the insulating layer 110 of the semiconductor wafer 108 according to one embodiment of the present invention, the semiconductor wafer 108 is placed on the heating block 318 in the reaction chamber 302. In one embodiment of the present invention, when the reaction barrier layer 202 is comprised of silicon nitride for example, in a plasma enhanced chemical vapor deposition process, the nitrogen ($N_2$) gas is controlled to flow from the nitrogen ($N_2$) source 304 into the reaction chamber 302 with a flow rate of from about 3000 sccm (standard cubic cm per minute) to about 6000 sccm (standard cubic cm per minute), the silane ($SiH_4$) gas is controlled to flow from the silane ($SiH_4$) source 306 into the reaction chamber 302 with a flow rate of from about 180 sccm (standard cubic cm per minute) to about 400 sccm (standard cubic cm per minute), and the ammonium ($NH_3$) gas is controlled to flow from the ammonium ($NH_3$) source 308 into the reaction chamber 302 with a flow rate of from about 20 sccm (standard cubic cm per minute) to about 60 sccm (standard cubic cm per minute).

During formation of the reaction barrier layer 202 of silicon nitride, reactants having oxygen such as the nitrogen oxide ($N_2O$) gas from the nitrogen oxide ($N_2O$) source 310 and the oxygen ($O_2$) gas from the oxygen ($O_2$) source 312 are turned off to prevent reaction of the oxygen containing reactant with the dielectric material comprising the insulating layer 110. Depending on the relative flow rates of the nitrogen ($N_2$) gas, the ammonium ($NH_3$) gas, and the silane ($SiH_4$) gas during formation of the reaction barrier layer of silicon nitride, the stoichiometry of the silicon nitride may vary and may have a chemical formula of $Si_3N_4$ or $SiN$ for example.

In addition, the temperature at the heating block 318 is set to be from about 300° C. to about 500° C. via the chamber temperature controller 322. The pressure within the reaction chamber 302 during the deposition of the reaction barrier layer 202 of silicon nitride is from about 3 torr to about 6 torr.

With the plasma enhanced chemical vapor deposition process according to one embodiment of the present invention, a high frequency RF signal is applied on the showerhead 314 from the high frequency RF signal generator 316. In one embodiment of the present invention, the high frequency RF signal applied on the showerhead 314 has a power of about 300 to 600 Watts. Additionally, a low frequency RF signal is applied on the heating block 318 that holds the semiconductor wafer 108 during the plasma enhanced chemical vapor deposition process of an embodiment of the present invention. In one embodiment of the present invention, the low frequency RF signal is generated from the low frequency RF signal generator 320 with a power of about 50 to 250 Watts.

The low frequency RF signal applied to the heating block 318 creates a voltage bias on the heating block 318. Such voltage bias on the heating block 318 attracts the plasma generated by the showerhead 314 toward the semiconductor wafer 108. Thus, plasma from the showerhead 314 is present near the semiconductor wafer 108 during the plasma enhanced chemical vapor deposition process of an embodiment of the present invention.

With the above-mentioned conditions within the reaction chamber 302, the semiconductor wafer 108 is placed within the reaction chamber 302 for a soak time period of about 5 to 60 seconds. During such a soak time period, the semiconductor wafer 108 heats up to the higher temperature of from about 300° C. to about 500° C. During such a soak time period, the high frequency RF signal from the high frequency RF signal generator 316 is not applied on the showerhead 314, and the low frequency RF signal from the low frequency RF signal generator 320 is not applied on the heating block 318.

Before the semiconductor wafer 108 is placed into the reaction chamber 302 for the soak time period, the reaction chamber 302 may be preseasoned. In such a preseasoning process, the reaction chamber 302 and the heating block 318 are preheated to a temperature of from about 350° C. to about 500° C. with the nitrogen ($N_2$) gas, the ammonium ($NH_3$) gas, and the silane ($SiH_4$) gas flowing into the reaction chamber 302 with the respective flow rates discussed above.

After the temperature soak time period, when the semiconductor wafer 108 has reached the deposition temperature, deposition of the reaction barrier layer 302 of silicon nitride takes place on the semiconductor wafer 108 when the high frequency RF signal from the high frequency RF signal generator 316 is applied on the showerhead 314 and when the low frequency RF signal from the low frequency RF signal generator 320 is applied on the heating block 318. The time period for the deposition of the reaction barrier layer 202 onto the semiconductor wafer 108 depends on the desired thickness of the reaction barrier layer 202 of silicon nitride which may be in a range of from about 50 Å (angstroms) to about 250 Å (angstroms).

Referring to FIGS. 3 an 4, after formation of the reaction barrier layer 202, the capping layer 204 is formed on the reaction barrier layer 202. The capping layer 204 may be formed using oxygen of the nitrogen oxide ($N_2O$) gas from the nitrogen oxide ($N_2O$) source 310 or of the oxygen ($O_2$) gas from the oxygen ($O_2$) source 312, within the reaction chamber 302. Processes for formation of various types of the capping layer 204, such as for use as an antireflective layer, a diffusion barrier layer, a passivation layer, an etch stop layer, or a CMP (Chemical Mechanical Polishing) stop layer, are known to one of ordinary skill in the art of integrated circuit fabrication. However, during formation of the reaction barrier layer 202 of silicon nitride, reactants having oxygen such as oxygen of the nitrogen oxide ($N_2O$) gas from the nitrogen oxide ($N_2O$) source 310 or of the oxygen ($O_2$) gas from the oxygen ($O_2$) source 312 are turned off to prevent reaction of the oxygen containing reactant with the dielectric material comprising the insulating layer 110.

Figure 5:
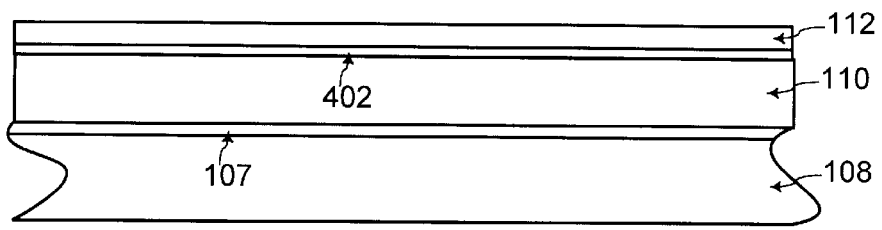
FIGS. 5, 6, 7, and 8 show cross-sectional views during formation of interconnect structures in a damascene process with formation of the reaction barrier layer on the insulating layer surrounding the interconnect structures before formation of a capping layer on the reaction barrier layer, according to an embodiment of the present invention.

In a second embodiment of the present invention, a capping and insulating structure is formed to surround interconnect structures in a damascene process. A damascene process is used when the interconnect structures are comprised of material such as copper that do not etch as easily as aluminum. Referring to FIG. 5, in that case, to prevent diffusion of copper, a diffusion barrier insulating material 107 is deposited on the semiconductor substrate 108 (or on a previous interconnect layer in other integrated circuits). The insulating layer 110 comprised of a low dielectric constant material is then deposited on the diffusion barrier insulating material 107. A reaction barrier layer 402 is then deposited on the insulating layer 110 before the capping layer 112 is deposited on the reaction barrier layer 402. The insulating layer 110 and the capping layer 112 of FIG. 5 are comprised of similar material as described herein for FIG. 3. The reaction barrier layer 402 of FIG. 5 is comprised of similar material and is deposited in a similar manner as described herein for FIG. 3.

Figure 6:
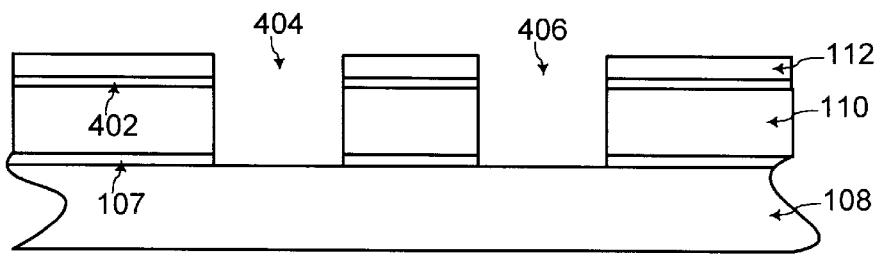
Figure 7:
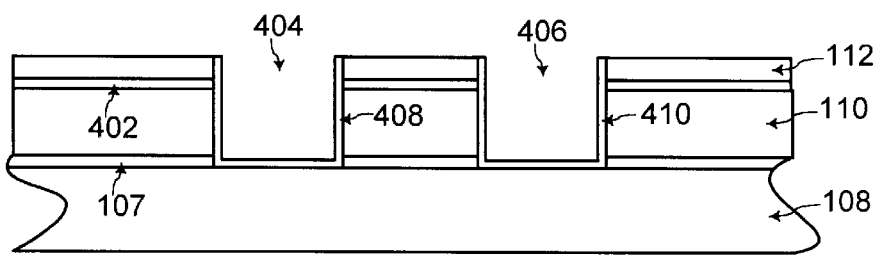
Figure 8:
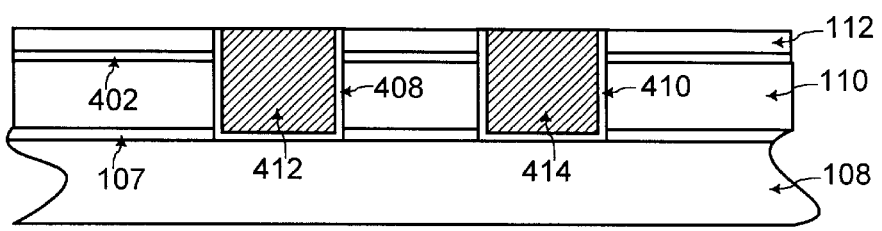

Referring to FIG. 6, a first opening 404 and a second opening 406 are then patterned and etched through the capping layer 112, the reaction barrier layer 402, the insulating layer 110, and the diffusion barrier insulating layer 107 using a photoresist patterning and etching process as known to one of ordinary skill in the art of integrated circuit fabrication. Referring to FIG. 7, for preventing diffusion of copper to be filled in the openings 404 and 406 into the surrounding insulating material, a first diffusion barrier layer 408 is deposited on the sidewalls and bottom wall of the first opening 404, and a second diffusion barrier layer 410 is deposited on the sidewalls and bottom wall of the second opening 406. Such diffusion barrier layers 408 and 410 are typically comprised of conductive diffusion barrier material, as known to one of ordinary skill in the art of integrated circuit fabrication. Referring to FIG. 8, conductive material such as copper is filled in the first opening 404 to form the first interconnect structure 412 and in the second opening 406 to form the second interconnect structure 414 formed with the damascene process.

In this manner, in either the interconnect structures 102 and 104 of FIG. 3 or the interconnect structures 412 and 414 of FIG. 8, the reaction barrier layer 202 or 402 formed between the insulating layer 110 and the capping layer 204 is comprised of a material that is not chemically reactive with the predetermined reactant, such as oxygen plasma for example, used during formation of the capping layer 204. The reaction barrier layer 202 or 402 prevents contact of the oxygen plasma with the insulating layer 110 to prevent reaction of oxygen plasma with the chemical bonds of the dielectric material of the insulating layer 110 that are chemically reactive with the oxygen plasma. In this manner, the low dielectric constant of the dielectric material comprising the insulating layer 110 is not increased by the formation of the capping layer 204.

The foregoing is by way of example only and is not intended to be limiting. For example, the present invention may be generalized to formation of any type of reaction barrier layer (aside from just the example of silicon nitride) between any type of insulating layer comprising any type of dielectric material having chemical bonds that are chemically reactive with any type of predetermined reactant (aside from just the example of oxygen containing reactant) used during formation of any type of capping layer, as would be apparent to one of ordinary skill in the art of integrated circuit fabrication from the description herein. In addition, any other materials mentioned herein are by way of example only.

The present invention is limited only as defined in the following claims and equivalents thereof.

We claim:

1. A method for forming an insulating and capping structure of an integrated circuit on a semiconductor wafer, the method including the steps of:

A. forming an insulating layer on said semiconductor wafer, wherein said insulating layer is comprised of a dielectric material having a low dielectric constant that is less than about 4.0 and having chemical bonds that are chemically reactive with a predetermined reactant;

B. forming a reaction barrier layer on said insulating layer, wherein said reaction barrier layer is comprised of a material that is not chemically reactive with said predetermined reactant; and C. forming a capping layer on said reaction barrier layer, wherein said capping layer is formed using said predetermined reactant;

and wherein said reaction barrier layer prevents contact of said predetermined reactant with said insulating layer to prevent reaction of said predetermined reactant with said chemical bonds of said dielectric material of said insulating layer that are chemically reactive with said predetermined reactant such that the low dielectric constant of said dielectric material of said insulating layer is not increased by said formation of said capping layer.

2. The method of claim 1, wherein said insulating layer is conformally deposited to surround interconnect structures of said integrated circuit.

3. The method of claim 1, wherein said insulating layer surrounds interconnect structures formed in a damascene process during fabrication of said integrated circuit.

4. The method of claim 1, wherein said insulating layer comprised of said dielectric material having low dielectric constant is comprised of HSQ (hydrogensilsesquioxane, $SiO_3H$).

5. The method of claim 1, wherein said insulating layer comprised of said dielectric material having low dielectric constant is comprised of MSQ (methylsilsesquioxane, $SiO_3CH_3$).

6. The method of claim 1, wherein said insulating layer comprised of said dielectric material having low dielectric constant is comprised of one of polyarylether material, porous silica, and organic doped silica.

7. The method of claim 1, wherein said predetermined reactant is oxygen plasma, and wherein said reaction barrier layer is comprised of silicon nitride.

8. The method of claim 7, wherein said silicon nitride has a selected one chemical formula of $Si_3N_4$ and SiN.

9. The method of claim 7, wherein said reaction barrier layer of silicon nitride has a thickness in a range of from about 50 Å (angstroms) to about 250 Å (angstroms).

10. The method of claim 7, wherein said capping layer is a selected one of an antireflective layer, a diffusion barrier layer, a passivation layer, an etch stop layer, and a CMP (Chemical Mechanical Polishing) stop layer.

11. A method for forming an insulating and capping structure of an integrated circuit on a semiconductor wafer, the method including the steps of:

A. forming an insulating layer to surround interconnect structures on said semiconductor wafer, wherein said insulating layer is comprised of a dielectric material having a low dielectric constant that is less than about 4.0 including a selected one of HSQ (hydrogensilsesquioxane, $SiO_3H$), MSQ (methylsilsesquioxane, $SiO_3CH_3$), polyarylether material, porous silica, and organic doped silica that each have chemical bonds that are chemically reactive with oxygen plasma;

B. forming a reaction barrier layer on said insulating layer, wherein said reaction barrier layer is comprised of silicon nitride that is not chemically reactive with oxygen plasma, and wherein said silicon nitride has a selected one chemical formula of $Si_3N_4$ and SiN and wherein said reaction barrier layer of silicon nitride has a thickness in a range of from about 50 Å (angstroms) to about 250 Å (angstroms); and C. forming a capping layer on said reaction barrier layer, wherein said capping layer is formed using oxygen plasma, and wherein said capping layer is a selected one of an antireflective layer, a diffusion barrier layer, a passivation layer, an etch stop layer, and a CMP (Chemical Mechanical Polishing) stop layer;

and wherein said reaction barrier layer prevents contact of oxygen plasma with said insulating layer to prevent reaction of oxygen plasma with said chemical bonds of said dielectric material of said insulating layer that are chemically reactive with oxygen plasma such that the low dielectric constant of said dielectric material of said insulating layer is not increased by said formation of said capping layer.

* * * * *